United States Patent
Hu et al.

(10) Patent No.: US 7,544,600 B2
(45) Date of Patent: Jun. 9, 2009

(54) BUMPING PROCESS AND BUMP STRUCTURE

(75) Inventors: Chun-Ping Hu, Hsinchu (TW);
Cheng-Chung Chen, Hsinchu (TW);
Chien-Wen Tsi, Hukou Township,
Hsinchu County (TW); Yu-Ching Lee,
Taishan Township, Taipei County (TW)

(73) Assignee: Elan Microelectronics Corporation,
Hsinchu (TW)

( * ) Notice: Subject to any disclaimer, the term of this patent is extended or adjusted under 35 U.S.C. 154(b) by 258 days.

(21) Appl. No.: 11/404,750

(22) Filed: Apr. 17, 2006

(65) Prior Publication Data

US 2006/0234491 A1    Oct. 19, 2006

(30) Foreign Application Priority Data

Apr. 19, 2005    (TW) .............................. 94112439 A (51) Int. Cl.
*H01L 21/44*    (2006.01)
(52) U.S. Cl. ..................................... 438/614
(58) Field of Classification Search ......... 438/612–614, 438/666, 686; 257/737, 752
See application file for complete search history.

(56) References Cited

U.S. PATENT DOCUMENTS

| | | | | | |
|---|---|---|---|---|---|
| 5,061,985 | A | * | 10/1991 | Meguro et al. | 257/751 |
| 6,479,376 | B1 | * | 11/2002 | Huang et al. | 438/613 |
| 6,717,243 | B2 | * | 4/2004 | Shinogi et al. | 257/673 |
| 7,009,300 | B2 | * | 3/2006 | Gacusan | 257/777 |
| 7,282,433 | B2 | * | 10/2007 | Tang et al. | 438/614 |
| 2006/0234491 | A1 | * | 10/2006 | Hu et al. | 438/614 |

* cited by examiner

*Primary Examiner*—Calvin Lee
(74) *Attorney, Agent, or Firm*—Rosenberg, Klein & Lee (57) ABSTRACT

A bumping process comprises forming a passivation layer having a planarized surface covering a pad on a substrate, forming a hole penetrating through the passivation layer to expose a contact surface of the pad, and forming a bump on the contact surface and planarized surface. The planarized surface will provide a larger effective area for pressing, thereby minimizing the pad, enhancing the mechanical strength at the peripheral of the pad, providing more selection flexibility for anisotropic conductive film, reducing the possibilities of short circuit and current leakage within the bump gap, and increasing the yield of the pressing process and the conductive quality of the bump.

19 Claims, 11 Drawing Sheets

BUMPING PROCESS AND BUMP STRUCTURE

FIELD OF THE INVENTION

The present invention is generally related to a bumping process and bump structure, and more particularly, to a planarized bump structure and a bumping process therefor.

BACKGROUND OF THE INVENTION

Wire bonding, tape automated bonding (TAB) and flip chip bonding are popular packages for integrated circuits (ICs). Generally, wire bonding is used in low-density package with less than 300 inputs/outputs (I/Os). In high-density packages, up to 600 I/Os may be provided by TAB, and flip chip package provides much higher package density with more than 600 I/Os. In flip chip package, it is required to form bumps on the pads of the integrated circuit for the pressing process in chip-on-glass (COG), chip-on-board (COB), chip-on-film (COF), or other package processes. In order to reduce electrical noises and to increase adhesion and conductivity, gold is typically used for the bump material, which makes the bumping process expensive and difficult. Therefore, improving the bump structure and bumping process becomes an important issue. On the other hand, the density and performance of a package limit the size and performance of a chip. As the size of IC shrinks, the IC package becomes the bottleneck to further shrink the IC, if the density and performance of the package are not enhanced, for example the size and pitch of the bumps are limited or the conductivity of the bumps are not good enough.

Figure 1:
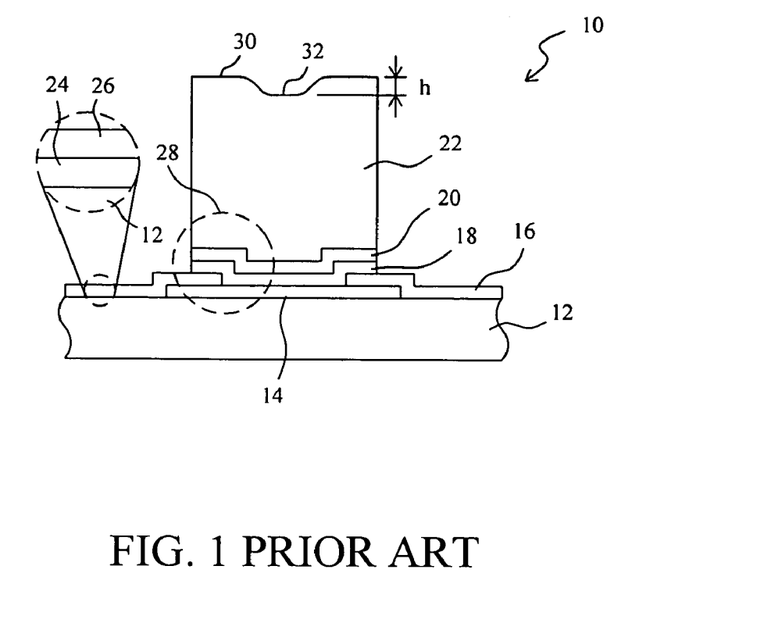
FIG. 1 is a cross-sectional view of a conventional gold bump structure.
Figure 2:
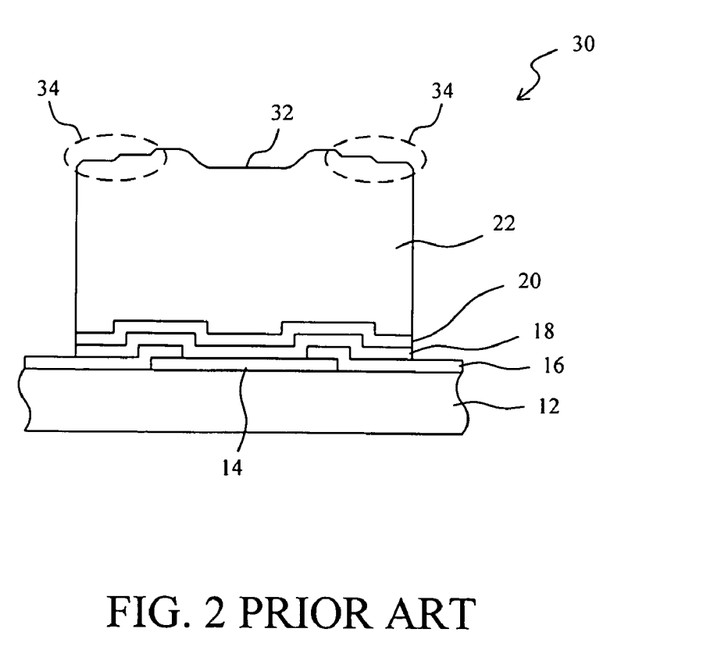
FIG. 2 shows an enlarged conventional gold bump structure.
Figure 3:
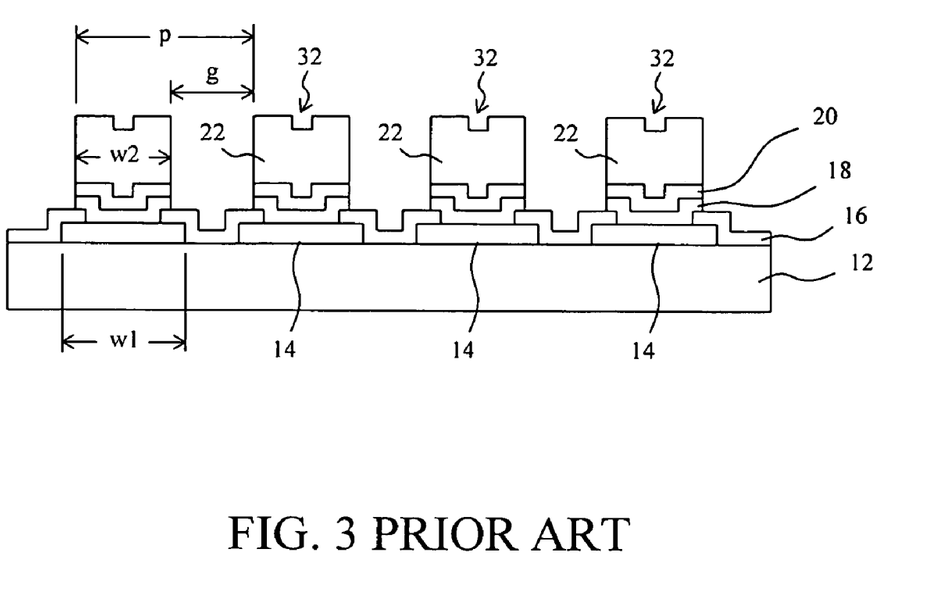
FIG. 3 is a schematic diagram of several conventional gold bumps on a substrate.

FIG. 1 shows a conventional gold bump structure 10, in which on a substrate 12 a pad 14 is partially covered by a passivation layer 16, an under bump metallization (UBM) 18 is formed on the exposed surface of the pad 14 and the peripheral passivation layer 16, and a gold film 20 and bump 22 are formed on the UBM 18. Typically, the material of the pad 14 is aluminum, the passivation layer 16 comprises a layer of silicon dioxide 24 and a layer of silicon nitride 26, and the UBM 18 is a stacked layer of titanium and tungsten. The gold film 20 is sputtered and has denser crystalline, to increase the adhesion between the gold bump 22 and UBM 18. The gold bump 22 grows by electro-plating from the gold film 20 and has larger crystalline and higher hardness. Since the passivation layer 16 always has step 28 at the peripheral of the pad 14, the upper surface of the bump 22 will have step 30 at its edge and therefore, only the central concave region 32 becomes an effective region during the pressing process. The roughness h of the upper surface of the bump 22 is about 2 μm. If a larger effective region 32 is required, the pad 14 has to be larger. However, if only the width of the bump 22 is increased, as shown in FIG. 2, the effective region 32 will remain nearly the same because the increased region 34 on the upper surface of the bump 22 is useless due to the uneven upper surface of the bump 22. FIG. 3 shows several bumps 22 on the substrate 12, where the width of the pad 14 is w1, the bump gap is g, and the bump pitch is p. The width w2 of the bump 22 is no greater than the width w1 of the pad 14, so the effective region 32 is small compared to the pad 14. To increase the effective region 32, it is required to have a larger pad 14. However, the contact density of the chip is thus lowered and the chip size cannot be minimized. In addition, a larger pad 14 will result in a larger bump pitch p. If the bump gap g remains constant, the only way to obtain an increase in the contact density of the chip is to shrink the pad 14. But shrinking the pad 14 causes the minimization of the effective region 32. There's difficulty to solve this problem using conventional techniques.

Figure 4A:
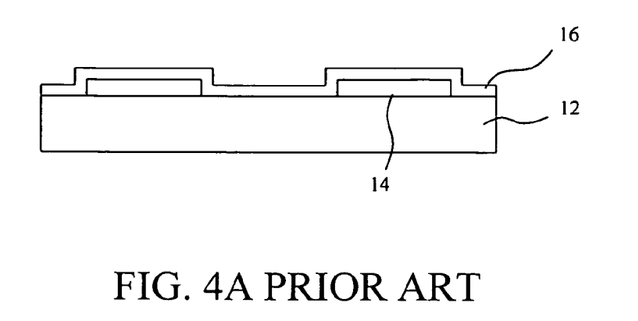
FIGS. 4A to 4E show a conventional bumping process.
Figure 4B:
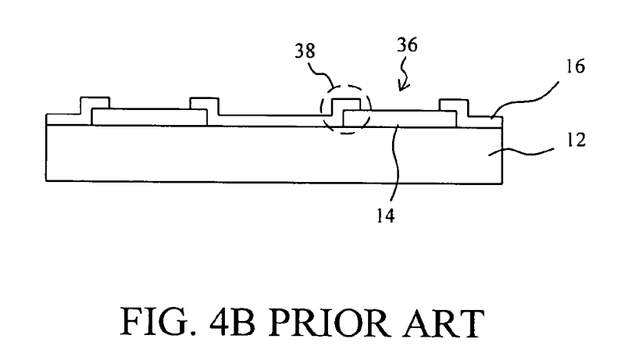
Figure 4C:
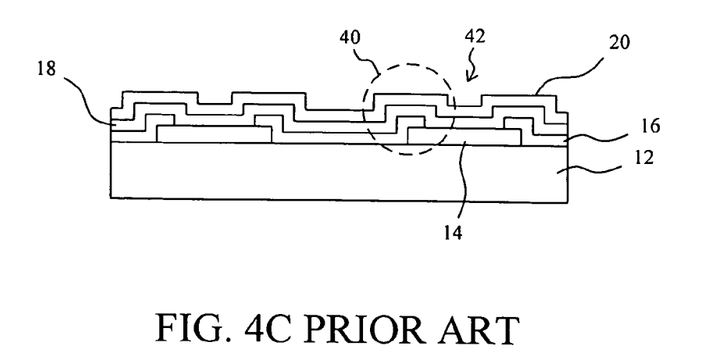
Figure 4D:
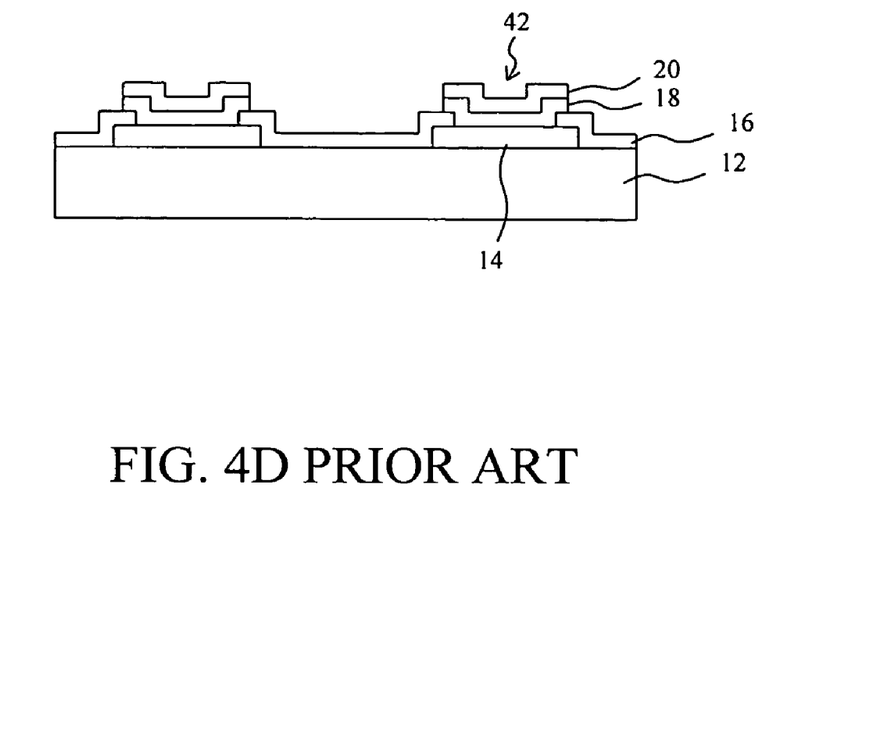
Figure 4E:
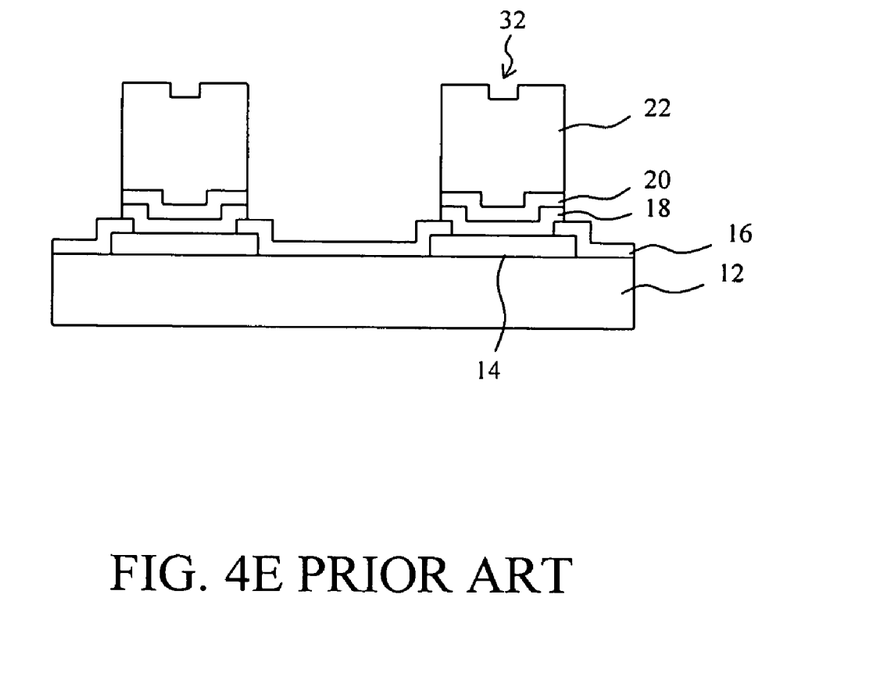

A conventional bumping process is shown in FIGS. 4A to 4E. In FIG. 4A, a passivation layer 16 with a thickness of 1.2 μm is deposited to cover pads 14 on a substrate 12. In FIG. 4B, the passivation layer 16 is etched to form openings 36 to expose the pads 14, and after this step, the passivation layer 16 will have steps 38 at the peripherals of the pads 14. In particular, the thicker the passivation layer 16 is, the higher the steps 38 are and the deeper the openings 36 are. In FIG. 4C, Ti/W stack with a deposition thickness of 800 Å is used as UBM 18, and a gold film 20 with a thickness of 800 Å is deposited thereon. In this step, due to the step 38, step 40 formed thereon is even wider. The thicker the UBM 18 is, the narrower the concavity 42 is. FIG. 4D shows the structure after the UBM 18 and gold film 20 are patterned. In FIG. 4E, gold bumps 22 are grown up from the gold film 20 and have a thickness of about 17 μm. It is therefore shown by this process that the steps 38 are inevitable. As a result, effective regions 32 always have small areas. The thicker the UBM 18 is, the smaller the effective region 32 is. Moreover, the thicker the passivation layer 16 is, the greater the roughness h is. Even though the semiconductor process is capable to minimize the chip size, the backend package does not catch up with the IC shrinkage and thus limits the minimized size of the chip.

Figure 5:
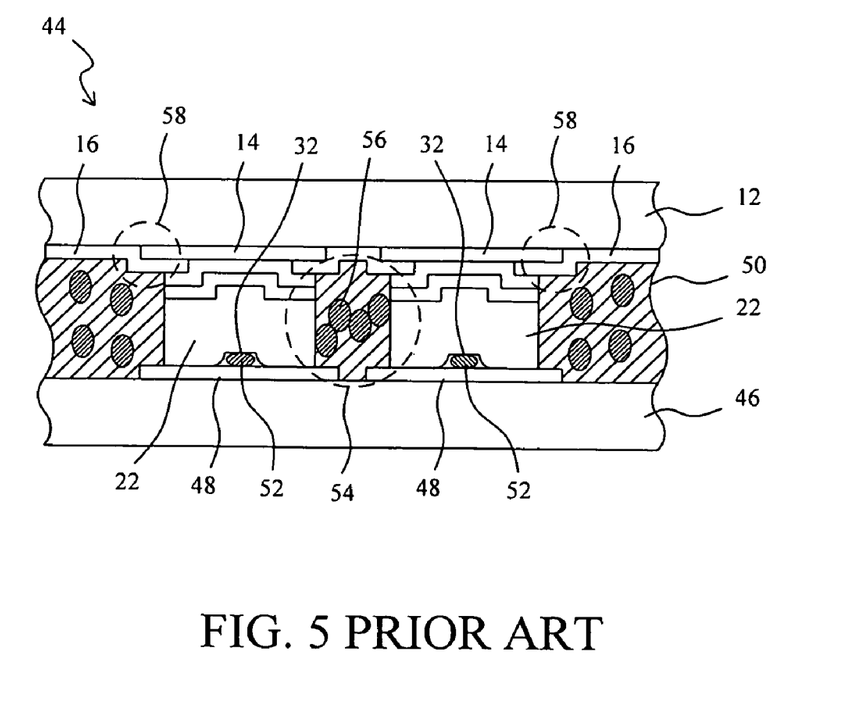
FIG. 5 is a schematic diagram of a conventional COG structure.

Further, a conventional bump structure has drawbacks during the pressing process. Referring to a COG structure 44 shown in FIG. 5, while pressing the bump 22 to a wire 48 on a glass substrate 46, an anisotropic conductive film (ACF) 50 is used therebetween as an interface. The ACF 50 is a polyimide (PI) with conductive particles thereof, and the conductive particles will form a conductive path in the pressing direction between the bump 22 and wire 48 during the pressing process. Since the surface roughness of the bump 22 is about 2 μm, the diameter of the conductive particles 52 within the ACF 50 has to be larger than 3 μm to construct an excellent conduction between the bump 22 and wire 48. However, if the conductive particles 52 are larger, then there will be fewer of them to be trapped in the effective region 32, and thus there's greater contact impedance and poor conduction quality after the pressing process. On the other hand, the conductive particles 56 with larger diameter inside the bump gap 34 will easily cause short or leakage between neighboring bumps 22, and thus lower the yield of the pressing process. If small conductive particles 52 are used, excellent connection between the bump 22 and wire 48 cannot be reached. Therefore, there's unbeatable difficulty in conventional technology. To satisfy the requirement of smaller size and higher I/O count of an IC chip, the pad 14 on the chip is required to be shrunk, and the effective region 32 is thus minimized, which causes the drop of the yield of the pressing process and conduction quality of the product. Furthermore, an elemental drawback of flip chip package is the weak mechanical strength at the peripheral region 58 of the bump 22, and damage happens easily due to lateral force. However, to obtain a smaller roughness h at the pressing surface of the bump 22 will have the step 28 to decrease, and a thinner passivation layer 16 could not overcome the drawbacks in weak mechanical strength.

Therefore, it is desired an improved bumping process and bump structure.

SUMMARY OF THE INVENTION

An object of the present invention is to provide a structure and process for a planarized bump to overcome the drawbacks of conventional art.

In a bumping process, according to the present invention, it is formed a passivation layer with a planarized surface to cover a pad on a substrate, the passivation layer is etched to form a hole penetrating therethrough to expose a contact surface of the pad, and a bump is formed on the contact surface and the planarized surface.

In a bump structure, according to the present invention, a passivation layer covering a portion of a pad on a substrate has a planarized surface, the pad has a contact surface, and a bump contacts the contact surface and the planarized surface.

Preferably, the passivation layer comprises several layers with different hardness in stack.

Preferably, the contact surface has a shape of stripe.

Since the passivation layer has the planarized surface to provide for larger effective region, the pad could be minimized, and the mechanical strength at the peripheral of the pad could be enhanced by increasing the thickness of the passivation layer. During the pressing process, since the bump has a larger effective area, there will be greater selection flexibility for the anisotropic conductive film, and the probabilities of short circuit and current leakage are reduced, thereby improving the yield of the pressing process and the conductive quality for the pad.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 6A:
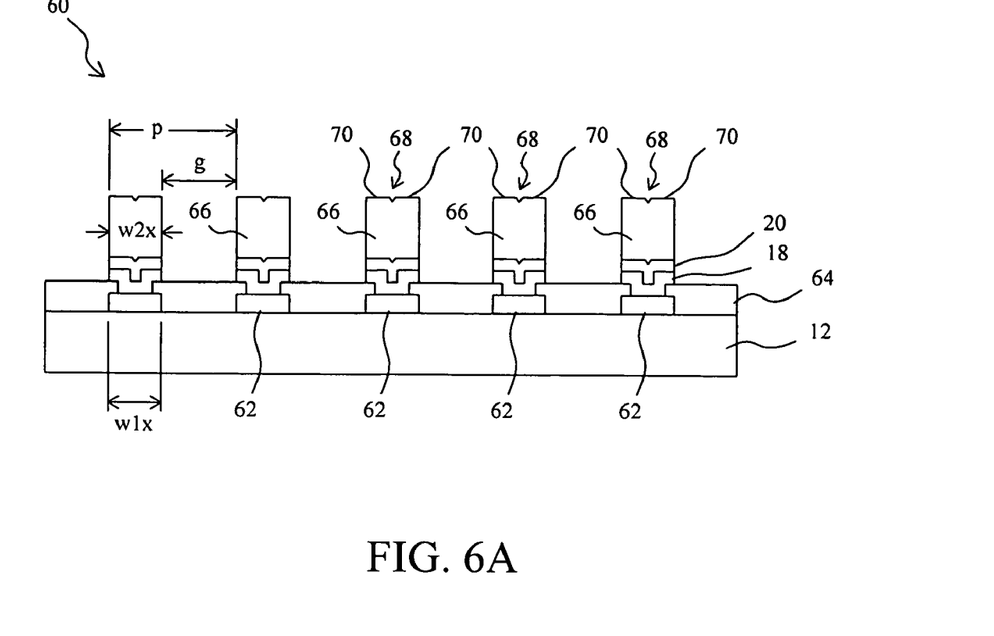
FIGS. 6A and 6B are two cross-sectional views of a gold bump structure according to the present invention.
Figure 6B:
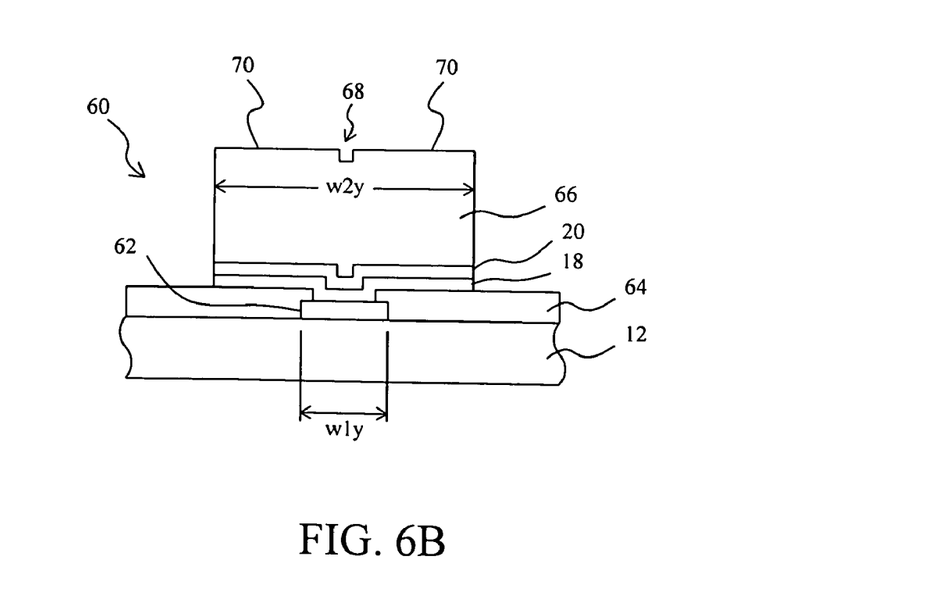
Figure 7A:
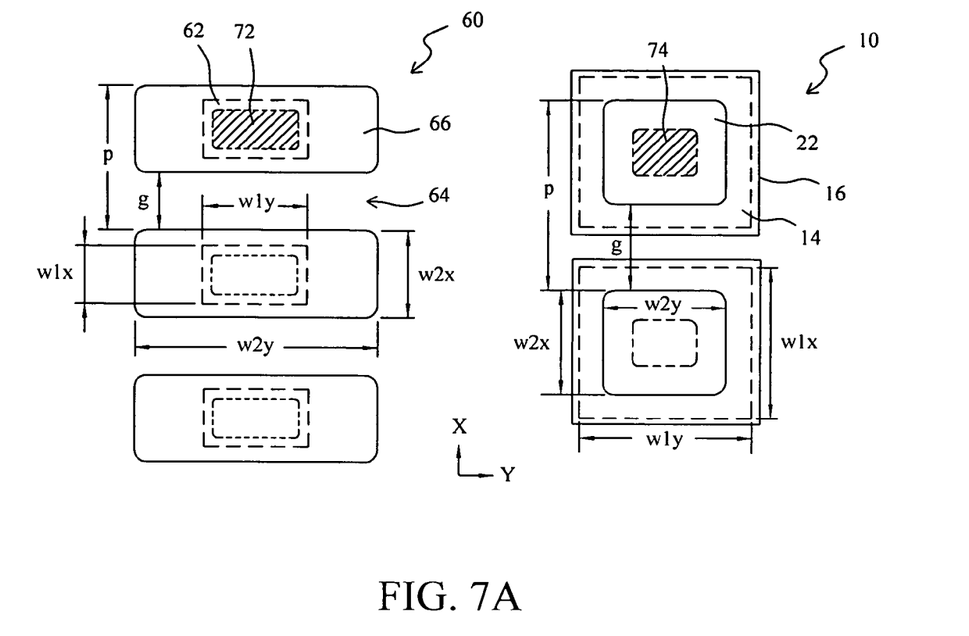
FIGS. 7A and 7B are two top views of a gold bump according to the present invention.
Figure 7B:
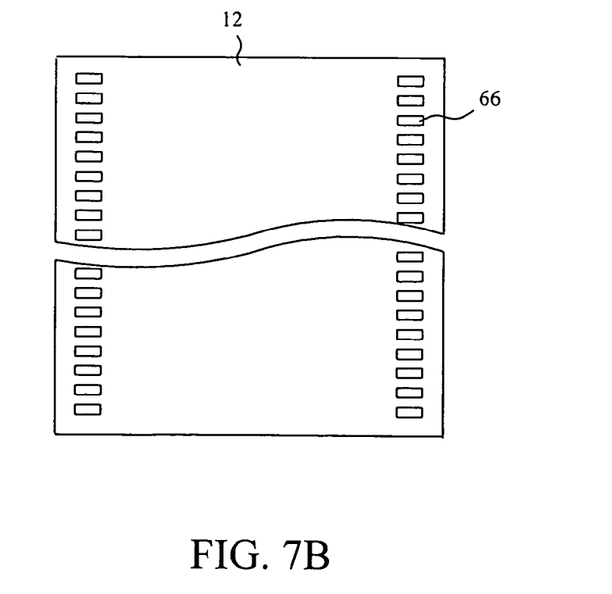

FIGS. 6A and 6B show a gold bump structure 60 according to the present invention, and FIGS. 7A and 7B show the top views, in which FIG. 6A is a cross-sectional view along the X direction and FIG. 6B is a cross-sectional view along the Y direction. Referring to FIGS. 6A and 6B, in the gold bump structure 60, a passivation layer 64 has a planarized surface and covers a portion of each pad 62 on a substrate 12, a UBM 18 and a gold film 20 are stacked on the pad 62 and passivation layer 64, and a gold bump 66 is on the gold film 20. The pad 62 is made of aluminum, aluminum alloy, or other metal or highly conductive alloy, and the passivation layer 64 comprises one or more layers of silicon dioxide, silicon oxide, silicon nitride, silicon oxy nitride, or other superior chemical resistive materials or their combination to protect the circuits within the substrate 12. The UBM 18 is used mainly to protect the pad 62 from being penetrated by any chemical particles during the following processes to affect the electrical characteristics of the product, and at the same time to improve the adhesion between the gold film 20 and pad 62. In one embodiment, the pad 62 is made of aluminum, and the UBM 18 comprises titanium (Ti) and tungsten (W) layers in the manner that the titanium layer is at the bottom to have good adhesion with the aluminum pad 62 and the tungsten layer is at the top to have good adhesion with the gold film 20. As shown in FIG. 6A, the pad 52 has a width $w1x$ in the X direction that is much smaller than a conventional pad, and the width $w2x$ of the bump 66 in the X direction is also smaller such that the bump pitch p can be minimized. However, in the Y direction, as shown in FIG. 6B, though the width $w1y$ of the pad 62 is also smaller than a conventional pad, the width $w2y$ of the bump 66 is much larger than the width $w1y$ of the pad 62. Due to the smaller pad 62, the concave region 68 at the center of the top surface of the bump 66 is minimized. If the UBM 18 is thicker, the concave region 68 may be completely eliminated. Since the passivation layer 64 has a planarized surface, a planarized region 70 occupies most of the top surface of the bump 66 and can be used as the effective region for pressing. Being different from the conventional bump structure 10, the effective region of the bump 66 is at the peripheral of the top surface rather the center; in other words, it is mainly at the region above the passivation layer 64.

FIG. 7A further illustrates the relation between the bump 66 and pad 62. For comparison, the conventional bump 22 and pad 14 are also shown at the right side of FIG. 7A. In the conventional bump structure 10, the pad 14 is larger than the bump 22, and thus, in order to have enough effective region on the bump 22, the pad 14 cannot be shrunk. While in the bump structure 60 according to the present invention, the bump 66 is larger than the pad 62, and therefore the pad 62 can be minimized. In the bump structure 60, the exposed contact surface 72 on the pad 62 for coupling to the bump 66 has a stripe shape. In the conventional bump structure 10, the exposed contact surface 74 on the pad 14 for coupling to the bump 22 has almost the same width in both the X and Y directions. FIG. 7B shows the high-density bump 66 on the substrate 12. The bump 66 has a stripe shape extending in the Y direction. In the X direction, since the pad 62 can be minimized, the bump 66 can be more tightly arranged. If more planarized region 70 on the bump 62 is desired, it can be achieved by increasing the width $w1y$ in the Y direction. Since the pad 62 can be minimized, more bumps 66 can be arranged on an IC of the same size to increase the I/O density and pin count.

Figure 8A:
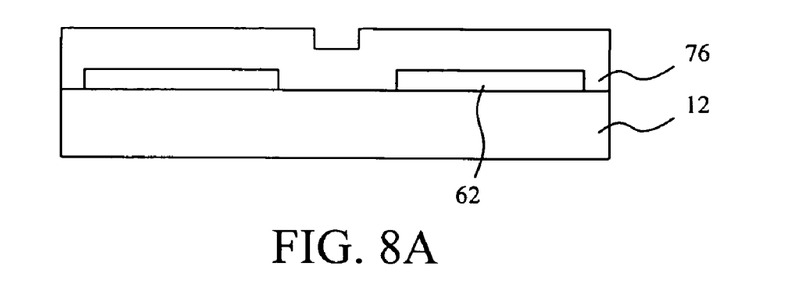
FIGS. 8A to 8G show a first bumping process according to the present invention.
Figure 8B:
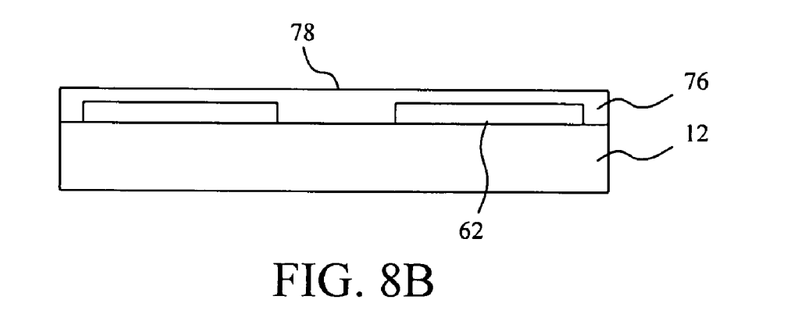
Figure 8C:
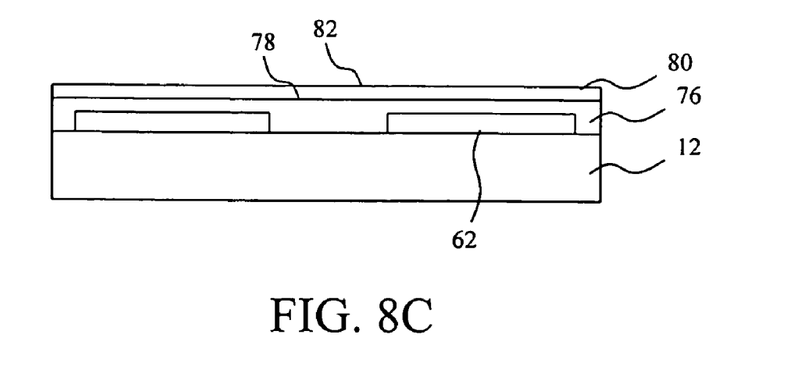
Figure 8D:
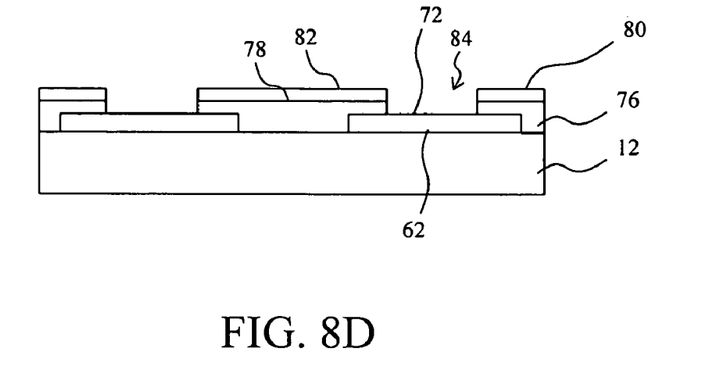
Figure 8E:
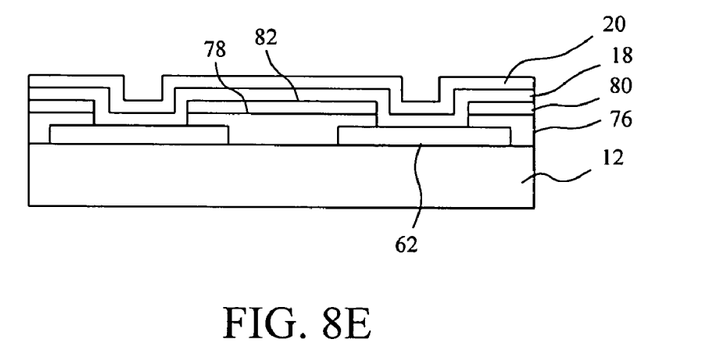
Figure 8F:
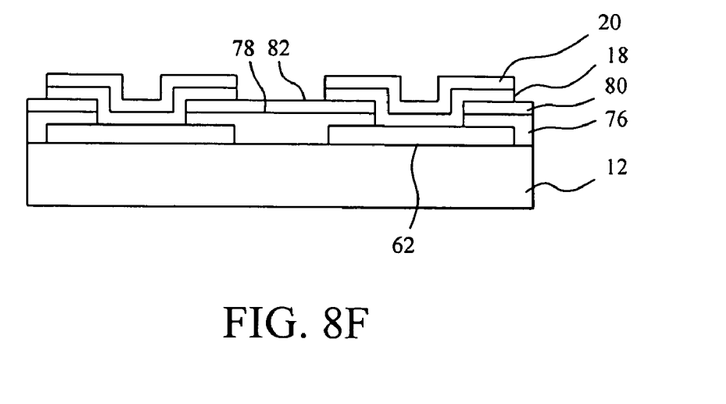
Figure 8G:
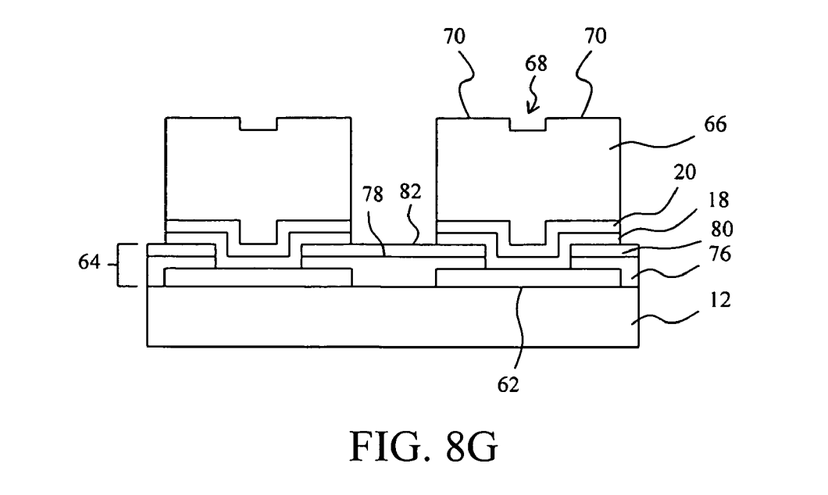

FIGS. 8A to 8G show a bumping process according to the present invention. In FIG. 8A, film 76 such as silicon dioxide or silicon oxide is deposited with thickness of 1000 to 1200 Å to cover pads 62 on a substrate 12, and etching back process such as chemical mechanical polishing (CMP) is used to etch the film 76 to leave a thickness of 600 to 800 Å, which results in a planarized surface 78 as shown in FIG. 8B. In FIG. 8C, film 80 such as silicon nitride or silicon oxy nitride is deposited with a thickness of 300 to 500 Å on the films 76. Since the film 76 has a planarized surface 78, the film 80 also has a planarized surface 82. The films 76 and 80 serve as the passivation layer 64 in FIG. 6A, and preferably, the film 80 is harder than the film 76. The softer film 76 is used to protect the substrate 12 and the surface of the pad 62, and the harder film 80 is used against force. As shown in FIG. 8D, the films 80 and 76 are etched to form an opening 84 that penetrates through the films 80 and 76 from the planarized surface 82 to the top surface of the pad 62, to expose a contact surface 72 on the pad 62. In FIG. 8E, a UBM 18 with a thickness of 800 Å is deposited on the contact surface 72 on the pad 62 and the planarized surface 82 of the film 80 by sputtering titanium and tungsten for example. A gold film 20 is deposited on the UBM 18 thereafter by sputtering. As shown in FIG. 8F, the gold film 20 and UBM 18 are patterned to define the bumps, and in FIG. 8G, a gold bump 66 is grown up from the gold film 20 for 15 to 20 μm by electro-plating. Since the passivation layer 76 and 80 has planarized surface, the central concavity 68 on the top surface of the bump 66 is very small or even none, and most of the top surface of the bump 66 is a planarized region 70.

Figure 9A:
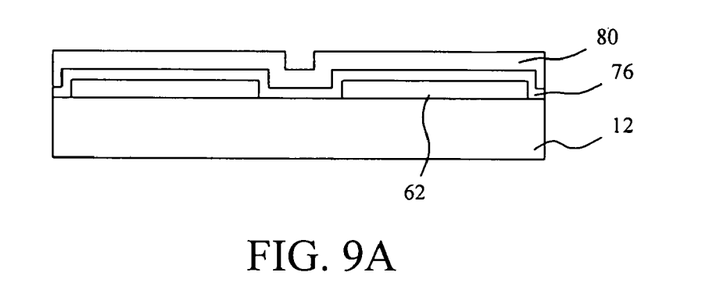
FIGS. 9A to 9D show a second bumping process according to the present invention.
Figure 9B:
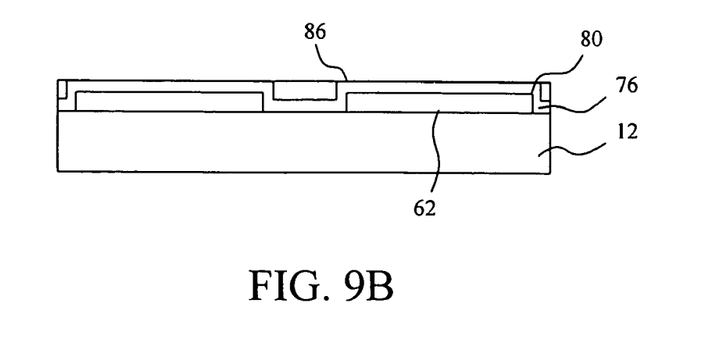
Figure 9C:
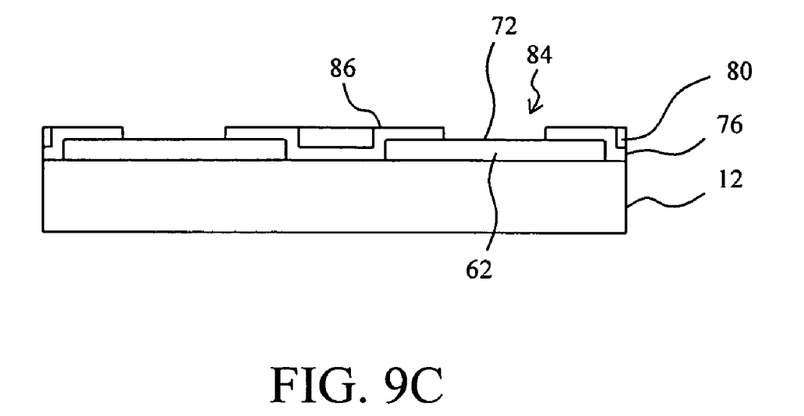
Figure 9D:
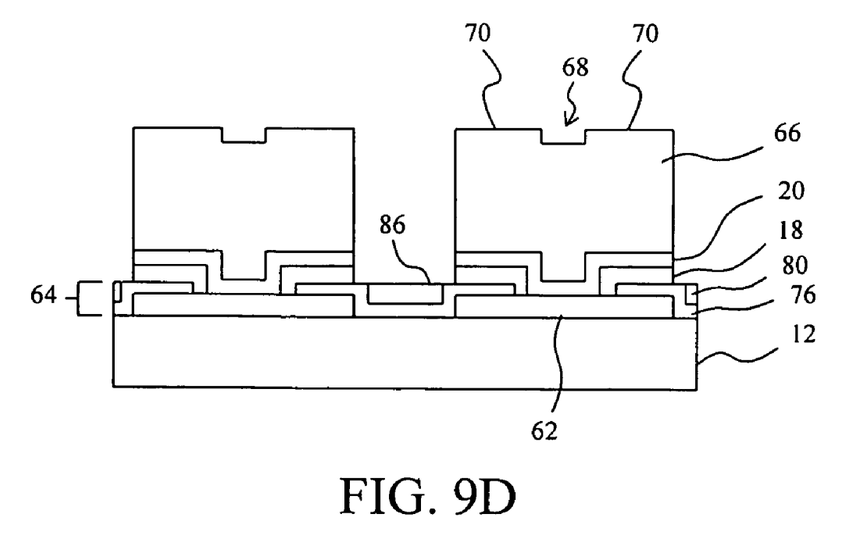

FIGS. 9A to 9D show another bumping process according to the present invention. In FIG. 9A, deposited films 76 and 80 cover pads 62 on a substrate 12, in which the film 80 is preferably harder than the film 76. The softer film 76 is used to protect the surfaces of the substrate 12 and pad 62, and the harder film 80 is used against force. For example, the film 76 comprises silicon dioxide or silicon oxide with a thickness of 200 to 800 Å, and the film 80 comprises silicon nitride or silicon oxy nitride with a thickness of 300 to 500 Å. In FIG. 9B, the films 76 and 80 are etched back by for example CMP, to leave them a total thickness of about 600 to 1000 Å, which results in a planarized surface 86. In FIG. 9C, an opening 84 is formed to expose a contact surface 72 on the pad 62. In FIG. 9D, sputtering is used for example to deposit titanium and tungsten to a thickness of 800 Å as a UBM 18 on the contact surface 72 and planarized surface 86, a gold film 20 is deposited by sputtering to a thickness of 800 Å on the UBM 18, the gold film 20 and UBM 18 are patterned to define the bumps, a gold bump 66 is grown up by electro-plating from the gold film 20 to a thickness of 15 to 20 μm. Since the planarized surface 86 is formed in previous step, the central concavity 68 on the top surface of the bump 66 is very small or even none, and most of the top surface of the bump 66 is a planarized region 70.

In the bumping process according to the present invention, since the passivation layer 64 with a planarized surface is used, on the planarized surface the UBM 18 has an area much larger than that on the contact surface 72 to obtain a maximized effective region 70. Thus the pad 62 is minimized.

Figure 10:
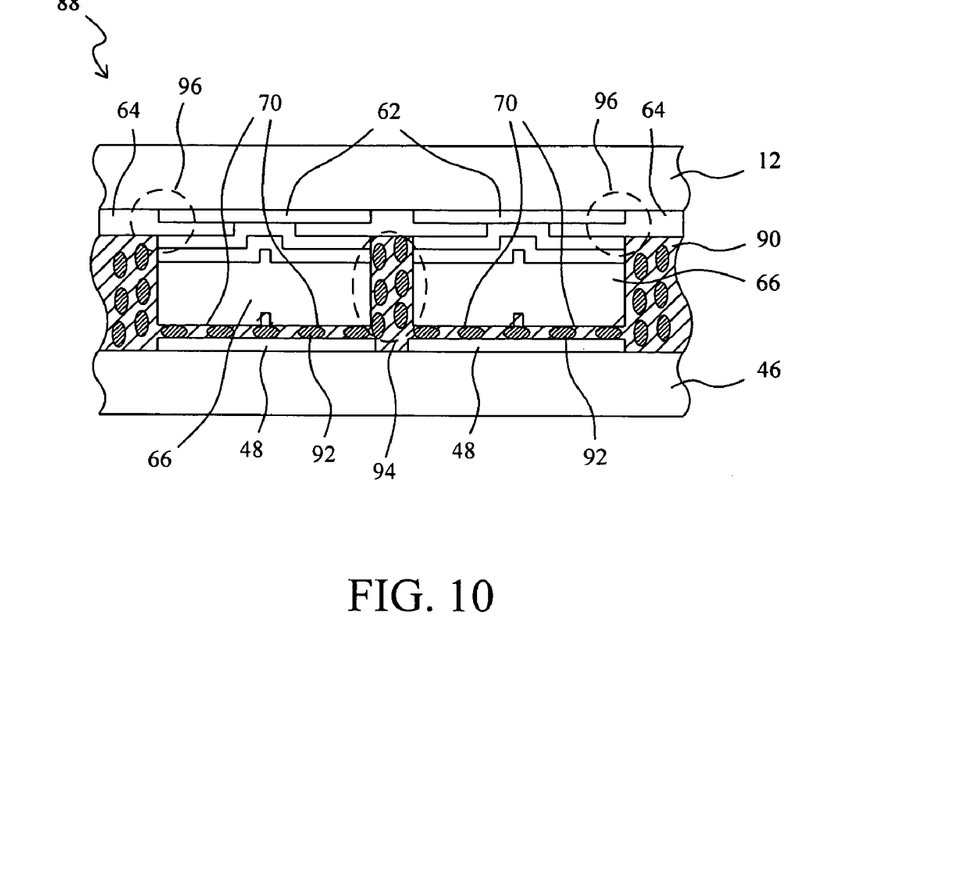
FIG. 10 is a schematic diagram of a COG structure according to the present invention.
Figure 11:
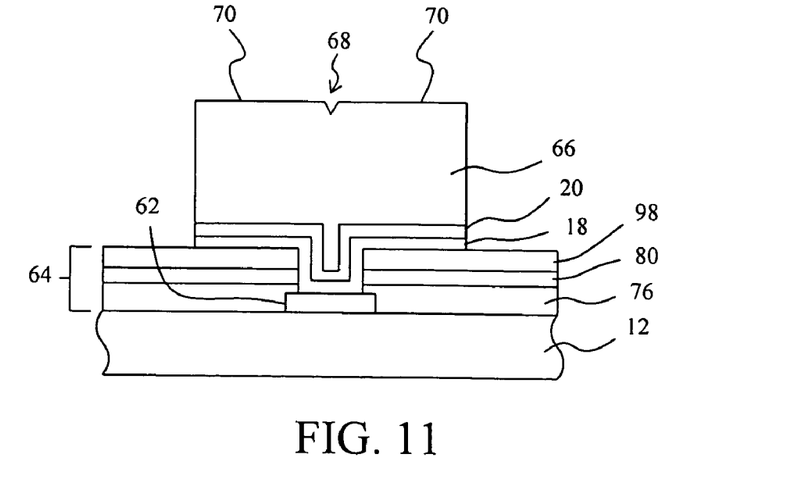
FIG. 11 is a schematic diagram of a gold bump with a thicker passivation layer.

FIG. 10 shows a structure 88 where the bump 66 is pressed to a wire 48 on a glass substrate 46. Being different from the conventional COG structure 44, the pressing effective region provided by the bump 66 is the planarized region 70. Since there's no problem about surface roughness thereof, it will have more flexibility in selecting the diameter of the conductive particles 92 in the ACF 90, for example 1 to 5 μm. Even though smaller conductive particles 92 are used, excellent conductivity can be still obtained. Since the effective region is the planarized region 70 that has larger area, the effective region 70 is capable to trap more conductive particles 92. If the conductive particles 92 have smaller diameter, the trapped amount of them is even higher and the conductive quality is much better. On the other hand, if the conductive particles 92 have smaller diameter, it is less possible for the conductive particles 92 within the bump gap 94 to cause short circuit or current leakage during the pressing process. Moreover, since the passivation layer 64 with a planarized surface is used, the mechanical strength at the peripheral 96 of the bump 66 is improved and damage will not easily happen thereto. In the bump structure 60, since it is used the passivation layer 64 with a planarized surface, the thickness of the passivation layer 64 is not limited. FIG. 11 shows an embodiment when a thicker passivation layer 64 is used. The passivation layer 64 comprises films 76, 80 and 98, in which the films 76 and 98 are silicon dioxide or silicon oxide, and the film 80 is silicon nitride or silicon oxy nitride. The total thickness of films 76, 80 and 98 is up to more than 1.2 μm and thus increases the mechanical strength of the corresponding structure.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A bumping process for forming a bump electrically coupled to a pad on a substrate, the process comprising the steps of:
   forming a passivation layer having a planarized surface for covering the pad;
   etching the passivation layer for forming a hole penetrating through the passivation layer to expose a contact surface of the pad, the planarized surface of the passivation layer extending about the hole along a plane substantially parallel to the pad; and
   forming the bump on the contact surface and planarized surface, wherein the bump is formed to extend laterally to at least a peripheral extent of the pad and define has a larger total surface area than a contact surface area of the pad, whereby the bump defines an effective region extending over the planarized surface of the passivation layer for flip chip engagement of a second substrate.

2. The process of claim 1, wherein the step of forming a passivation layer having a planarized surface comprises the steps of:
   depositing a first layer on the pad;
   planarizing a surface of the first layer; and
   depositing a second layer on the first layer.

3. The process of claim 2, wherein the second layer comprises at least one layer harder than the first layer.

4. The process of claim 2, wherein the first layer comprises silicon dioxide or silicon oxide, and the second layer comprises silicon nitride or silicon oxy nitride.

5. The process of claim 2, wherein the first layer comprises silicon dioxide or silicon oxide, and the second layer comprises layers of silicon nitride or silicon oxy nitride and silicon dioxide or silicon oxide in stack.

6. The process of claim 2, wherein the step of planarizing a surface of the first layer comprises etching back the first layer.

7. The process of claim 6, wherein the step of etching back the first layer comprises chemical mechanical polishing the first layer.

8. The process of claim 1, wherein the step of forming a passivation layer having a planarized surface comprises the steps of:
   depositing a stack of layers over the pad; and
   planarizing a surface of the stack.

9. The process of claim 8, wherein the stack comprises:
   a first layer; and
   a second layer on the first layer;
   wherein the second layer is harder than the first layer.

10. The process of claim 9, wherein the first layer comprises silicon dioxide or silicon oxide, and the second layer comprises silicon nitride or silicon oxy nitride.

11. The process of claim 8, wherein the stack comprises:
   a first layer;
   a second layer on the first layer, the second layer harder than the first layer; and
   a third layer on the second layer, the third layer softer than the second layer.

12. The process of claim 11, wherein the first and third layers comprise silicon dioxide or silicon oxide, and the second layer comprises silicon nitride or silicon oxy nitride.

13. The process of claim 8, wherein the step of planarizing a surface of the stack comprises etching back the stack.

14. The process of claim 13, wherein the step of etching back the stack comprises chemical mechanical polishing the stack.

15. The process of claim 1, wherein the hole has a strip shape at the contact surface.

16. The process of claim 1, wherein the step of forming the bump on the contact surface and planarized surface comprises the steps of:
   forming an under bump metallization having a first area on the contact surface and a second area on the planarized surface, the second area greater than the first area; and
   forming a conductive bump contacting the under bump metallization.

17. The process of claim 16, wherein the step of forming a conductive bump contacting the under bump metallization comprises the steps of:
   sputtering a gold film on the under bump metallization; and
   growing a gold bump from the gold film.

18. The process of claim 1, wherein the step of forming the bump on the contact surface and planarized surface comprises the steps of:
   forming an under bump metallization on the contact surface and planarized surface; and
   forming a conductive bump contacting the under bump metallization, the conductive bump having a planarized surface on an opposite side to the under bump metallization.

19. The process of claim 18, wherein the step of forming a conductive bump contacting the under bump metallization comprises the steps of:
   sputtering a gold film on the under bump metallization; and
   growing a gold bump from the gold film.

* * * * *